United States Patent [19]
Jeng et al.

[11] Patent Number: 5,877,074
[45] Date of Patent: Mar. 2, 1999

[54] METHOD FOR IMPROVING THE ELECTRICAL PROPERTY OF GATE IN POLYCIDE STRUCTURE

[75] Inventors: Pei-Ren Jeng; Chun-Cho Chen, both of Hsinchu, Taiwan

[73] Assignee: Holtek Microelectronics, Inc., Hsinchu, Taiwan

[21] Appl. No.: 998,958

[22] Filed: Dec. 29, 1997

[30] Foreign Application Priority Data

Dec. 9, 1997 [TW] Taiwan ................................. 86118529

[51] Int. Cl.$^6$ ................... H01L 21/3205; H01L 21/4763
[52] U.S. Cl. ............................................................. 438/592
[58] Field of Search ................................. 438/592, 301, 438/597

[56] References Cited

U.S. PATENT DOCUMENTS

| | | | |
|---|---|---|---|
| 5,441,904 | 8/1995 | Kim et al. ................................. | 438/597 |
| 5,554,566 | 9/1996 | Lur et al. ................................. | 438/655 |
| 5,614,428 | 3/1997 | Kapoor ..................................... | 438/301 |
| 5,652,156 | 7/1997 | Liao et al. ............................... | 438/301 |
| 5,710,454 | 1/1998 | Wu ........................................... | 257/413 |

*Primary Examiner*—Charles Bowers
*Assistant Examiner*—Craig Thompson
*Attorney, Agent, or Firm*—W. Wayne Liauh

[57] ABSTRACT

A method for improving the electrical property of gate in polycide structure is disclosed. First, a gate oxide layer is formed on the surface of the silicon substrate. The following procedure acts as one of the key points for the invention comprising the process steps of (1) forming a highly-doped polysilicon layer on the gate oxide, (2) forming an undoped amorphous silicon layer on the polysilicon layer, and followed by (3) forming a tungsten silicon layer on the amorphous silicon. Next, annealing at high temperature and in short time is performed. Such a stacked gate structure has low resistance and can solve the following problems: (1)peeling of tungsten silicide after annealing, (2) degradation of the electrical property of gate due to the diffusing and penetration of fluorine atoms coming from tungsten silicide.

7 Claims, 3 Drawing Sheets

METHOD FOR IMPROVING THE ELECTRICAL PROPERTY OF GATE IN POLYCIDE STRUCTURE

BACKGROUND OF THE INVENTION

1. Field of the Invention

This invention relates to a semiconductor manufacturing technology and, more particularly, to a method for improving the electrical property of gate in a polycide structure.

2. Description of the Prior Art

Polysilicon is used as the gate electrode in modern ULSI(ultra-large scale integration) MOS devices. Along with the increasing density of integration, propagation of signals becomes a great problem because linewidth becomes narrower and line length becomes longer. So a material with low resistivity and high melting point is necessary instead of polysilicon. Refractory metal silicides having polysilicon as underlayer are often used to meet said requirements. Tungsten silicide ($WSi_x$, $x \approx 2.2$–$2.6$) is the most commonly used silicide nowadays. This structure is shown in FIG. 1. A gate oxide 12 is formed on substrate 11, then polysilicon 13 is deposited on said gate substrate, finally silicide 14 is deposited on said polysilicon. After definition through lithography processes, a polycide gate structure is formed.

However, there are some issues that have to be overcomed when tungsten silicide is deposited on gate polysilicon. Firstly, tungsten the silicide films have high stress (~1000 Mpa), so during subsequent high temperature processes, such as post-annealing, peeling of silicide film has been a problem. In addition, as reported in the paper entitled, "Direct Evidence of Gate Oxide Thickness Increase In Tungsten Polycide Process" by S. L. Hsu et al, IEEE Electron Device Letters, Vol. 12, No. 11, November 1991, pp.623–625, the fluorine atoms which diffuse from tungsten silicide films to gate oxides cause additional growth. This additional gate oxide will cause the degradation of electrical breakdown field of $SiO_2$ and a decrease in saturation current to degrade the device performance.

The fluorine atoms just mentioned are emitted from one of the reactant gases, hexafuoride tungsten ($WF_6$), during the deposition of silicide. And because polysilicon underlying silicide offers a lot of grain boundaries for fluorine atoms to go along with and through into the gate oxide. One approach that has been suggested to overcome this problem is reported by J. B. Price et al in Semicon West, May 10, 1986, where high temperature CVD tungsten silicide employing dichlorosilane ($SiH_2Cl_2$) and hexafluoride tungsten ($WF_6$) was used instead of monosilane ($SiH_4$) and $WF_6$. It has the advantage of lower concentration of fluorine atoms. Another approach is set forth in U.S. Pat. No. 5,364,803. According to the teaching therein and as illustrated in FIG. 2, a thin conducting diffusion barrier layer 21, titanium nitride, is deposited overlying the gate polysilicon to prevent fluorine atoms from diffusing into the gate polysilicon layer. But the additional layer of titanium nitride complicates the processes, especially the following etching process, because titanium nitride needs different etching gases from which of polysilicon. So a practical way is to prevent penetration of fluorine atoms by improving the structure of polysilicon gate structure. One related approach was mentioned in U.S. Pat. No. 5,441,904, where a two-layered polysilicon gate is formed with different grain sizes through different reactants to prevent the diffusion of fluorine atoms. The two-layered polysilicon gate is not so practical for two times of deposition of polysilicon with different reactant gases. So a practical and economic method is disclosed in the present invention to provide for an improved polycide gate structure.

SUMMARY OF THE INVENTION

It is therefore an object of this invention to provide a gate electrode of a semiconductor with improved electrical property.

Another object of this invention is to provide one method to prevent fluorine atoms from diffusing into polysilicon then penetrating into the gate oxide.

Another object of this invention is to provide one method to prevent tungsten silicide film from peeling.

And another object is to simplify the manufacturing process.

The foregoing objects are achieved in the present invention in an preferred embodiment, the invention includes: forming a gate oxide film upon a substrate, depositing a polysilicon film overlying the gate oxide, depositing an amorphous silicon overlying the polysilicon film, and forming a tungsten silicide film on the amorphous silicon film, and then patterning the gate structure.

BRIEF DESCRIPTION OF THE DRAWINGS

The invention, as well as its many advantages, may be further understood by the following detailed description and drawings in which:

FIG. 1 is a cross-section view of a conventional polycide gate structure.

FIG. 2 is a cross-section view of a conventional polycide gate structure improved by adding a titanium nitride film.

FIG. 3 is a cross-section view of silicon substrate, following the growth of gate oxide film.

FIG. 4 is a cross-section view of the substrate region depicted in FIG. 3, following the growth of polysilicon.

FIG. 5 is a cross-section view of the substrate region depicted in FIG. 4, following the growth of amorphous silicon.

FIG. 6 is a cross-section view of the substrate region depicted in FIG. 5, following the growth of tungsten silicide.

FIG. 7 is a cross-section view of the substrate region depicted in FIG. 6, following the patterning of gate electrode.

DETAILED DESCRIPTION OF THE PREFERRED EMBODIMENT

Figure 1:
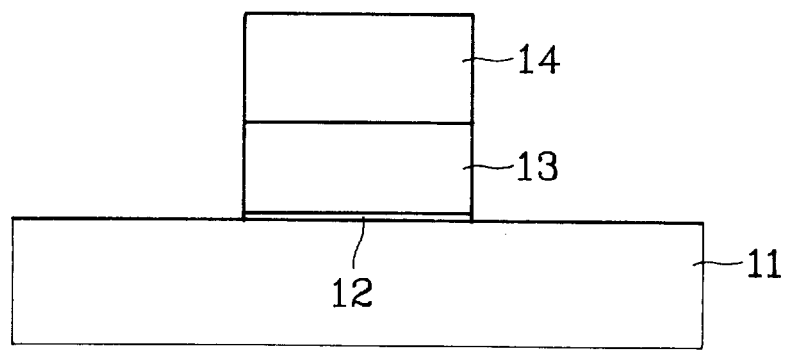
FIG. 1 through FIG. 2 are cross-section views of the gate electrodes formed by the prior art.
Figure 2:
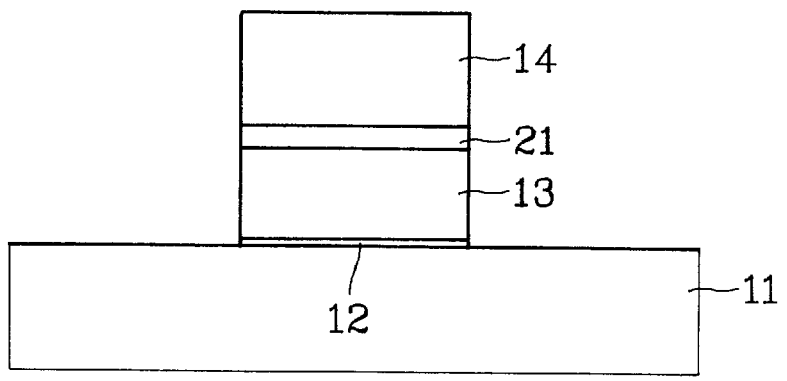
Figure 3:
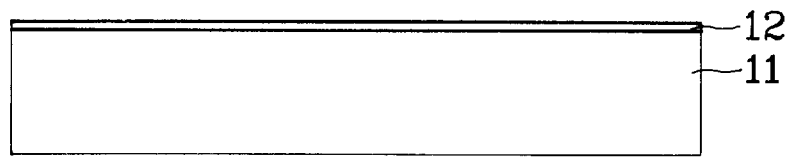
FIG. 3 through FIG. 7 describe the sequence of the processes of forming a polycide gate structure according to the present invention.

Referring to FIG. 1, gate oxide 12 is formed over silicon substrate 11 through thermal oxidation at a high temperature above 900° C. and to a thickness ranging from 40 Å to 400 Å.

Figure 4:
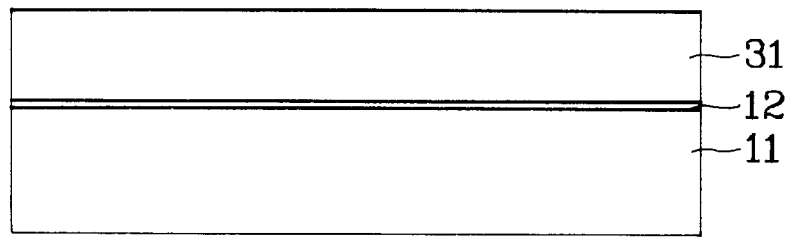

Then referring to FIG. 4, polysilicon 31 doped with phosphorus is in-situ deposited over gate oxide 12. The deposition is performed by low pressure chemical vapor deposition (LPCVD) at pressure ranging from 0.3 to 0.6 Torr and at temperature ranging from 575° C. to 650° C., to the thickness of between about 1100 and 1300 Å. Meanwhile, phosphine ($PH_3$) is introduced to cause phosphorus doped into polysilicon along with the deposition of polysilicon (in-situ). The concentration of phosphorus in polysilicon ranged from $1.0 \times 10^{19}$ to $1.0 \times 10^{22}/cm^3$. This deposition of polysilicon with doping in-situ has the benefit of simplifying process. Because the conventional technologies of doping, including thermal diffusion and ion implantation all take the complicated steps of moving the substrate into the operating equipment and final removement of oxide which is over substrate.

Figure 5:
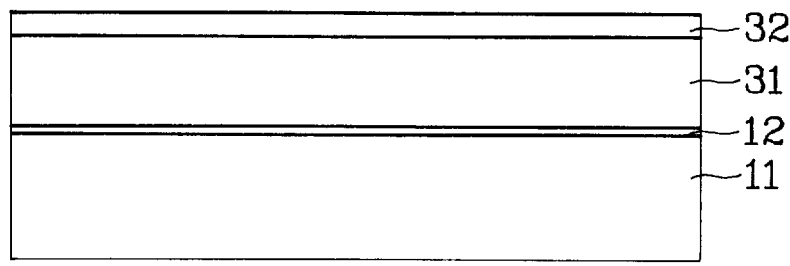

Next, amorphous silicon 32 is deposited over polysilicon 31 just by lowering the temperature to between about 500° C. and 600° C., as illustrated in FIG. 5. And phosphorus doping is stopped when growing amorphous silicon. Doped polysilicon is easier for fluorine atoms to diffuse through than undoped polysilicon according to the report by Yoshimi Shioya et al, in J. Appl. Phys. 61(11), 1 Jun. 1987. The thickness of amorphous silicon is between about 200 and 400 Å. This layer of undoped amorphous silicon can act as a diffusion barrier for fluorine atoms because it offers no grain boundaries. On the other hand, the interface between amorphous silicon and polysilicon can help further prevent fluorine atoms from penetration during deposition of tungsten silicide.

Figure 6:
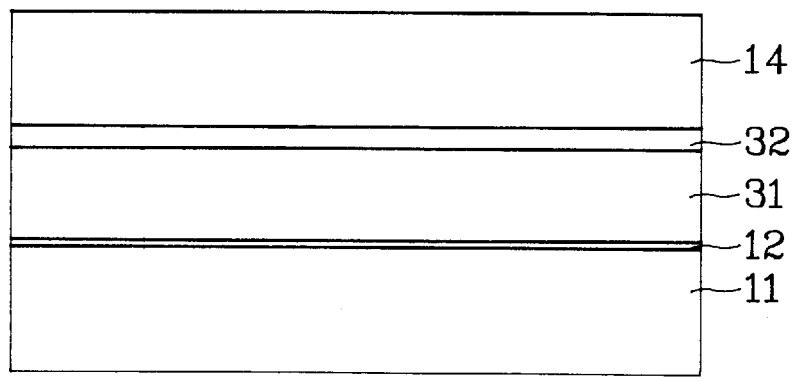

Tungsten silicide ($WSi_x$) 14 is then deposited over amorphous silicon from the reaction between dichlorosilane ($SiH_2Cl_2$) and tungsten hexafluoride ($WF_6$), as shown in FIG. 6. The deposition is achieved by chemical vapor deposition at temperature ranging from 470° C. to 600 ° C. and the flow rate of dichlorosilane between 150 to 250 sccm with the flow rate of tungsten hexafluoride between about 3 to 5 sccm. Peeling can be prevented by growing tungsten silicide over amorphous silicon instead of polysilicon. It is derived from the report in paper, "Tungsten silicide Films deposited by $SiH_2Cl_2$—$WF_6$ Chemical Reaction" by Tohru Hara et al, J. Electrochem. Soc. Vol. 136, No. 4, April 1989. It shows that "Film adhesion can be markedly improved by employing Si-rich films." and "The average value of x in the uniform region for each film was 2.33 and 2.23 on amorphous Si and Si substrates, respectively. These profiles show that a more uniform profile was attained in film formed on amorphous Si buffer layer.", wherein said amorphous Si denotes amorphous silicon. As Si/W ratio is enhanced by depositing tungsten silicide over amorphous silicon, adhesion ability is also improved and peeling can be avoided.

Figure 7:
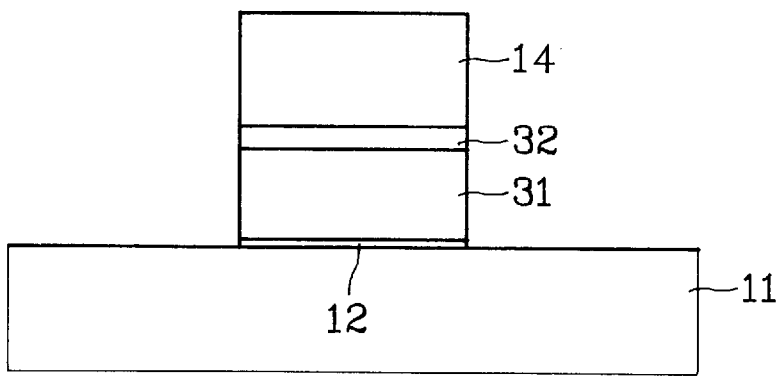

After the gate electrode is patterned through photolithography processes, annealing is applied to lower the resistance of the gate electrode, as shown in FIG. 7. Annealing takes place at temperatures between 800° C. to 950° C. and the time of annealing takes only 30 min. After annealing, amorphous silicon will become polysilicon and, meanwhile, phosphorus atoms will diffuse into this original undoped amorphous silicon to further reduce the resistance of the gate electrode. The diffusion of fluorine atoms during annealing can be prevented by the misalignment of the grain boundaries of two polysilicon layers. So the diffusing of fluorine atoms during deposition of tungsten silicide and annealing at high temperatures can both be avoided effectively by the way presented in this invention.

In summary, the progresses and advantages of the present invention are described as following. The deposition of polysilicon in-situ with doping has been simplified by the process disclosed in the present invention, because the conventional steps of moving the substrate into the operating equipment and the final removal of oxide over the substrate are eliminated. And amorphous silicon underlying tungsten silicide plays the role of a diffusion barrier to fluorine atoms during deposition because it offers no grain boundary so that the path of diffusing of fluorine atoms will increase. The interface between polysilicon and amorphous silicon works further to stop diffusing of fluorine atoms. Thus, the concentration of fluorine atoms can be effectively minimized and the electrical property of the gate electrode will be improved. Furthermore, Si-rich tungsten silicide formed over amorphous silicon instead of polysilicon has better adhesion ability and uniformity, so the peeling of tungsten silicide can be avoided. After annealing, amorphous silicon will become polysilicon and phosphorus atoms will diffuse into the original undoped amorphous silicon. In this way resistance of the gate electrode can be reduced. Moreover, the diffusing of fluorine atoms during annealing can be avoided because of the misalignment of the grain boundaries of the two polysilicon layers. As a result, the present invention is able to prevent fluorine atoms from diffusing during deposition of tungsten silicide as well as to allow the annealing to be conducted at high temperature effectively. As a result, the electrical property of gate will be greatly improved.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of improving the electrical quality of gate in polycide structure, comprising the steps of:

(a) forming a gate oxide layer on a silicon substrate;
   (b) forming a polysilicon layer on the surface of said gate oxide;
   (c) forming a layer of undoped amorphous silicon on the surface of said polysilicon layer;
   (d) forming a tungsten silicide layer on the surface of said undoped amorphous silicon layer;
   (e) performing at least one photolithography process to define at least one gate electrode; and
   (f) annealing;
   (g) wherein no annealing is performed between steps (c) and (e), so as to prevent said amorphous silicon from turning into polysilicon.

2. The method according to claim 1, wherein said polysilicon is formed through in-situ deposition with doping.

3. The method according to claim 2, wherein said in-situ deposition with doping is at pressure ranging from 0.3 to 0.6 Torr and temperature ranging from 575° C. to 650° C., the thickness of said polysilicon is ranging from 1100 to 1300 Å.

4. The method according to claim 2, wherein said first doping is performed with phosphorus.

5. The method according to claim 4, wherein the concentration of said phosphorus is ranging from $1.0 \times 10^{19}$ to $1.0 \times 10^{22}/cm^3$.

6. The method according to claim 1, wherein said undoped amorphous silicon is deposited at pressure ranging from 0.3 to 0.6 Torr and temperature ranging from 500° C. to 600° C., the thickness of said undoped amorphous silicon is ranging from 200 to 400 Å.

7. The method according to claim 1, wherein said temperature of annealing is ranging from 800° C. to 950° C.

* * * * *